United States Patent [19]

Magori et al.

[11] 4,404,502
[45] Sep. 13, 1983

[54] ENERGY SAVING CIRCUIT ARRANGEMENT FOR A PIEZOELECTRIC POSITIONING ELEMENT

[75] Inventors: Valentin Magori; Peter Kleinschmidt, both of Munich, Fed. Rep. of Germany

[73] Assignee: Siemens Aktiengesellschaft, Berlin & Munich, Fed. Rep. of Germany

[21] Appl. No.: 328,481

[22] Filed: Dec. 8, 1981

[30] Foreign Application Priority Data

Dec. 23, 1980 [DE] Fed. Rep. of Germany ....... 3048632

[51] Int. Cl.³ ............................................. H01L 41/08
[52] U.S. Cl. .................................. 318/116; 310/316; 310/328
[58] Field of Search ................... 310/314 R, 316–319, 310/339, 328; 318/316, 317, 318, 116; 331/158, 165; 328/67; 307/252 B; 320/1; 361/156

[56] References Cited

U.S. PATENT DOCUMENTS

| | | | |
|---|---|---|---|
| 3,154,700 | 10/1964 | McNaney | 310/8.3 |
| 3,200,270 | 8/1965 | Vossler | 318/116 |
| 3,405,327 | 10/1968 | Cole et al. | 320/1 |
| 3,443,190 | 5/1969 | Christiansen | 328/67 |
| 3,760,203 | 9/1973 | Guntersdorfer | 310/8.1 |
| 3,911,298 | 10/1975 | Borsdorf | 310/8.1 |
| 3,916,373 | 10/1975 | Schroder | 340/16 |
| 3,921,014 | 11/1975 | Jayne | 310/314 |

FOREIGN PATENT DOCUMENTS

| | | |
|---|---|---|
| 2551603 | 6/1977 | Fed. Rep. of Germany . |
| 1339688 | 9/1963 | France . |
| 143128 | 7/1980 | German Democratic Rep. . |
| 1475671 | 6/1977 | United Kingdom . |
| 2022901 | 12/1979 | United Kingdom . |

OTHER PUBLICATIONS

*Industrial Research*, vol. 4, 1978, "Serving the $76-Billion World-Wide R&D Industry".
Spanner et al., "Feinste Positionierungen mit Piezo-Antrieben", *Feinwerktechnik & Messtechnik*, (1979), pp. 181-183.

*Primary Examiner*—J. D. Miller
*Assistant Examiner*—D. L. Rebsch
*Attorney, Agent, or Firm*—Hill, Van Santen, Steadman & Simpson

[57] ABSTRACT

A circuit arrangement for a piezoelectric positioning element is formed of a series connection of a capacitive element, an inductance, and first switch to be controlled, said series circuit being connected across at least one piezoelectric body of the positioning element. The capacitive element, which may be another piezoelectric body of the same positioning element but which is operated in reverse phase, has at least approximately the same capacitance value as a capacitance of the first piezo-electrical body. The inductance is dimensioned sufficiently large in order to magnetically intermediately store substantially an entire energy increment to be transferred between the positioning element and the capacitive element. The first switch is connected to permit termination of a charge transfer. A series circuit is formed of an electrical energy source for charging and recharging and a second switch, said series circuit being connected parallel to the positioning element or the capacitive element. A controllable short-circuit switch is connected parallel to the capacitive element or parallel to the positioning element. In this way, the activation energy of the piezoelectric body is recovered on de-activation, for re-use on the next cycle.

20 Claims, 9 Drawing Figures

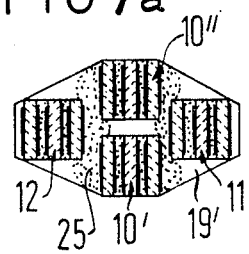
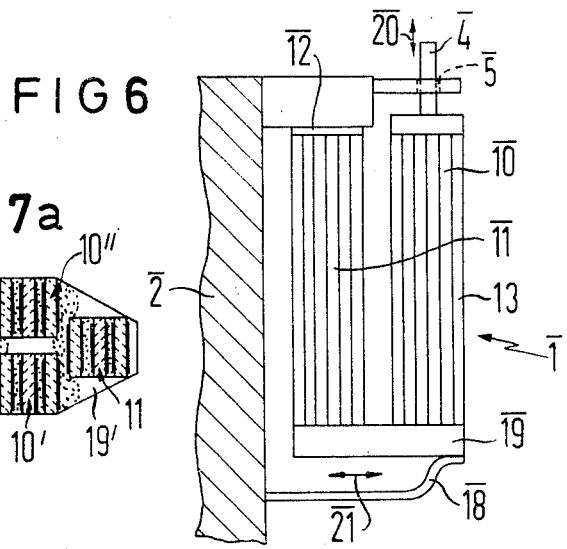
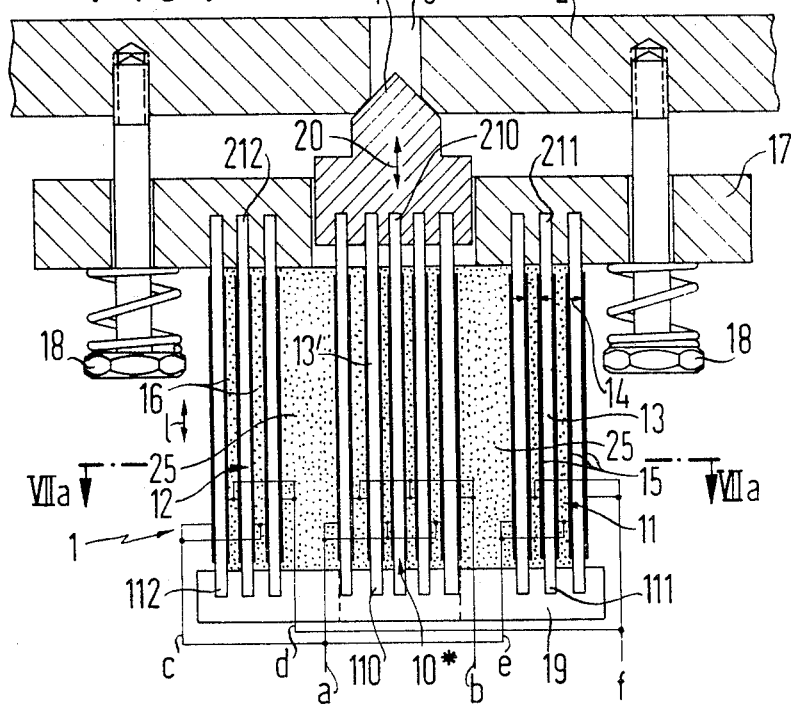

ENERGY SAVING CIRCUIT ARRANGEMENT FOR A PIEZOELECTRIC POSITIONING ELEMENT

BACKGROUND OF THE INVENTION

The present invention relates to a circuit for a piezoelectric positioning or control element or the like which is alternately charged and discharged. The positioning element has a plurality of piezoelectric bodies designed to be charged and discharged in reverse phase.

In piezoelectric positioning elements as are known, for example in the disclosure of the German patent application P 30 40 563.1 incorporated herein by reference, piezoelectric components are provided whose electrically effected elongation or contraction is employed for mechanical work output. As a rule, such positioning elements have a long piezoelectric body, which, for example consists of a stack of discs placed atop one another or of long strips secured to one another. The discs or the strips are piezo-ceramic material such as, for example, lead zirconate titanate, varium titanate and the like.

Such a positioning element represents an electrical capacitance to be charged for an electrical voltage applied thereto. During the course of this charging operation, the corresponding piezo-ceramic body executes an elongation or contraction, depending upon the operational sign of the piezoelectric effect or, respectively, of the electro-mechanical coupling factor which is effective in the corresponding case. In an analogous manner, the contraction or enlargment effect can also be exploited which occurs when a previously electrically charged piezo-ceramic body is short-circuited and discharges its electrical capacitance.

Although the changes in length of a piezo-ceramic body are relatively slight upon application of electrical voltage, perhaps comparable to the movement of a tappet which is driven by a cam, a piezo-ceramic positioning or control element is in a position to exert rather high forces and to produce a corresponding work output. The electrical energy which must be exerted for this purpose, however, is not only this work output but, rather, the reactive energy component of the charging of the electrical capacitance added thereto, said component being a multiple of the mechanical power output. For the sake of completeness, let it also be pointed out that a high voltage having a magnitude of from one thousand to several thousand volts is required for the operation of a piezoelectric positioning element as specified. This voltage has to be controlled in accordance with the desired positioning operation, and a corresponding electronic circuit has to be made available for generating and controlling said voltage. In particular, the overall energy requirement plays a part in the positioning operation when the positioning element is to be driven from a battery or when only a low voltage DC of, for example, 12 volts, is available.

SUMMARY OF THE INVENTION

An object of the present invention is to specify an electronic circuit with which an energy-saving operation of a positioning element as specified with a piezo-ceramic transducer can be operated.

This object is inventively achieved with a circuit comprising a series connection of a capacitive element, an inductance, and a first switch to be controlled, the series circuit being connected to terminals of at least one piezoelectric body of the positioning element. The capacitive element is at least nearly of a same capacitance value as a capacitance of the at least one piezoelectric body between said terminals. The inductance is dimensioned sufficiently large in order to be able to magnetically intermediately store an entire energy increment to be transferred between the terminals and the capacitive element. The first switch is provided for termination of a charge transfer of a respective transfer current. A series circuit is provided comprised of an electrical energy source for initial charging and recharging, and a second switch. This series circuit is connected parallel to either the positioning element or the capacitive element. A controllable short circuit switch is connected parallel to the capacitive of positioning element.

The invention is particularly of significance for piezoelectric bodies whose piezoelectric effect depends on the coupling factor $K_{31}$ or, respectively, on the piezoelectric constant $D_{31}$. These are the aforementioned piezoelectric bodies formed of long strips or, respectively, film strips disposed in parallel next to one another. Such piezoelectric bodies have a less favorable conversion degree per se, i.e. an unfavorable ratio of the electrical (active and reactive) energy flowing into the piezoelectric body at the terminals of said body and the converted power. For example, a particularly high component of electrical reactive power occurs in them which would be destroyed given shortcircuiting of the piezoelectric body for the transition into the initial state.

The invention is based on the principle of storing the reactive energy occurring upon discharge of the previously charged piezoelectric body in an electrical capacitor with the capacitance C in order to allow this energy stored in the capacitor to flow back into the piezoelectric body when said piezoelectric body is recharged. The degree of possible storage depends, however, on the capacitance ratio of the piezoelectric body and the electrical storage capacitor, so that, for example, given capacitance values of equal size, only 50% can be respectively stored and 50% of the energy remains in the body. The same applies to the inverse process of the return flow. It is different when according to this invention an inductance L is connected in series with these two capacitances of the positioning element and the capacitor, and the transfer circuit is interrupted in the zero passage of the transfer current. The inductance has a value L such that it is at a position to mechanically intermediately store the entire electrical energy from the positioning element (or of the capacitor in the retransfer). For the inductance, this means that, given the frequency $$f = \frac{1}{2\pi \sqrt{L \cdot \overline{C}}} = \frac{1}{2t_u}$$

and given the resultant current load, it should still exhibit a quality $Q \geq 3$, where $\overline{C}$ is the capacitance value of the series connection consisting of the piezoelectric body and the additional capacitor. The transfer time $t_u$ should at least lie within the magnitude of the reciprocal value of the mechnical operating resonant frequency f of the positioning element built into the device ($t_u \approx (1)/2f$ or should be greater.

In the ideal case, 100% of the reactive energy of the previously charged piezo-ceramic element can therefore be transferred to a capacitor having the same dimensions and, vice versa, this energy can again be refed from the capacitor. The only thing which must then be resupplied from a connected generator in this ideal case is the electrical power used as mechanical work. Associated with the invention is the feature of preventing for at least one of the capacitances (positioning element and/or additional capacitor) accumulation of residual charges in this capacitance, given repeated transfers.

The invention can be advantageously employed particularly where it is not only a single piezoelectric body which must be charged and discharged, but rather where two piezoelectric bodies in push-pull must be charged and discharged for the operation as a positioning element with one piezoelectric body functioning as an energy storage for the other piezoelectric body with respect to the reactive energy and vice-versa. Such a function, for example, exists, given a tandem positioning element in accordance with the pending German patent application P 3048631.8 relating to the present invention and incorporated herein by reference. Moreover, the invention can also be employed given more than two piezoelectric bodies which can be divided between two groups of such piezoelectric bodies functioning in push-pull. A potentially remaining residual imbalance of the capacitance of the piezoelectric bodies of the two groups can then be compensated with respect to one another by assistance of a significantly smaller auxilliary capacitor.

BRIEF DESCRIPTION OF THE DRAWINGS

FIGS. 6, 7 and 7a show preferred positioning or control elements used in the invention.

DESCRIPTION OF THE PREFERRED EMBODIMENTS

Figure 1:
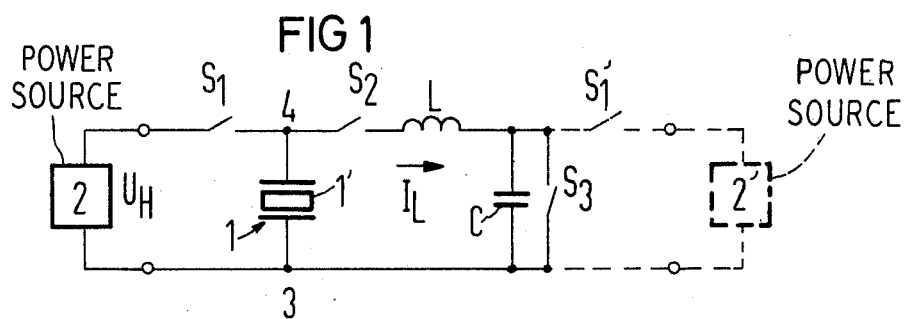
FIG. 1 shows a basic circuit arrangement of the invention.

The circuit diagram of FIG. 1 already reveals the fundamental function of the invention in terms of its underlying concept. For actuating the positioning of control element 1 into its second positioning state, i.e. for the electrical charging of the piezoelectric body 1' contained in said positioning element, voltage $U_H$ is applied across the switch S1 to be closed. This voltage, for example, is supplied from an electrical source 2 with an internal resistance $R_i$. Upon completion of the charge of the positioning element 1, the element has reached its second, mechanical positioning state. The initial state without application of voltage to the positioning element 1 is here the first positioning state. In the second positioning state, in addition to the electrical energy to be supplied from the source 2 which is used for the mechanical work of the positioning element 1, the source 2 will have additionally had to supply the reactive energy contained in the electrical capacitance of the positioning element 1, whereby the reactive energy is a multiple of the electrical energy converted into optimally derivable mechanical work.

After the second positioning state has been reached, the switch S1 is opened, whereby the second positioning state is essentially retained. Given short-circuiting of the terminals 3 and 4 of the positioning element 1 to one another, a charge equalization of the capacitance of the positioning element 1 ensues such that the element returns into the first positioning state. Upon short-circuiting, the discharge current thereby flowing effects the dissipation of the reactive energy contained in the positioning element 1. According to the invention, however, this should not be lost. For this purpose (given an open switch S1), the switch S2 is closed and the current flow across the inductance L and the capacitor C (to terminal 3) leads to a drop of the charging state of the positioning element 1, which is nearly as fast, and simultaneously leads to a charging of the capacitor C. As mentioned above, the transfer time $t_u$ can amount to half the period duration (1/f) or can be prescribed longer.

The discharge of the positioning element 1 and the charging operation of the capacitor C, dependent upon the inductance L and the capacitance values, has a chronological state in which the electrical voltage at the positioning element 1 is practically equal to zero, since the entire reactive energy previously contained in the positioning element 1 is situated in the capacitor C. At this moment of greatest charging voltage of the capacitor C to the value $U_C$, the switch S2 is opened and a back transfer to the positioning element 1 is suppressed, so that the first uncharged positioning state of the positioning element 1 is again achieved.

As already specified above, the capacitance values of the positioning element 1 and of the capacitor C should be selected of the same size insofar as possible. The inductance L and the capacitor C together with the electrical capacitance of the positioning element 1 form a resonant circuit in which a voltage at the positioning element 1 decreases in accordance with $\frac{1}{2}U_B(1+\cos\omega t)$ and the voltage at the capacitor C increases in accordance with $\frac{1}{2}U_B(1-\cos\omega t)$. Given capacitances of 1 and of C which are of the same size, the radian frequency amounts to $$\omega = \pi 2 \cdot f = \frac{1}{\sqrt{L \cdot C/2}}$$

The point in time of actuation of the switch S2 is given by half the period duration $t_u$ of this radian frequency $\omega$.

The renewed transition of the positioning element 1 from its first positioning state into its second positioning state is achieved by means of a renewed closing of the switch S2, whereby the electrical energy stored in the capacitor C (apart from line losses) is again fully transferred to the positioning element 1 and the switch S1 is again opened after time $\tau/2$. An unavoidable energy loss can be compensated by means of a subsequent, brief closing of the switch S1. In such manner a sufficient charge is allowed to re-flow from the source 2 into the positioning element 1 so that the original voltage $U_H$ is again present on said positioning element 1. In this state, the capacitor C is largely discharged.

A residual charge nonetheless remaining at the capacitor C must be eliminated by means of closing the switch S3. Such a residual charge would accumulate and, given an alternating change of the positioning states of the positioning element 1, would reduce the amount of difference of the positioning states from one another (from time to time). The feature of eliminating the residual charge can also be carried out at the positioning element 1. However, it suffices that this feature is carried out at the capacitor C or at the positioning element, i.e. on the occasion of each second positioning operation.

Figure 2:
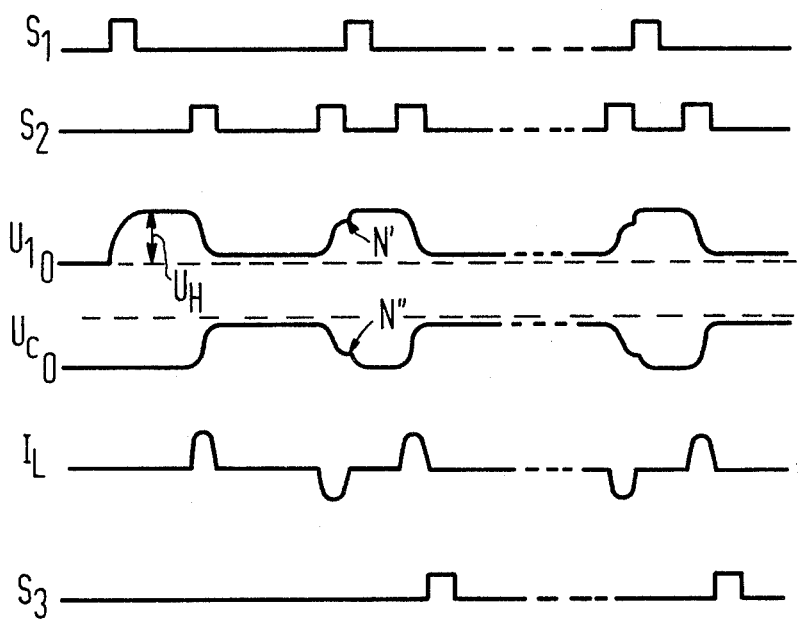
FIG. 2 shows an operating schematic diagram relating to FIG. 1.

In six lines below one another, FIG. 2 shows the chronological sequence of individual functions and operations of the circuit according to FIG. 1 which are parallel to one another. The time is entered on the abscissa. The first line shows the function of the switch S1. The second line indicates the actuation of the switch S2. The charging state of the positioning element 1 resulting therefrom, i.e. the path of the voltage $U_S$ across the positioning element, is shown in line 3. Line 4 shows the corresponding voltage path at the capacitor C and line 5 shows the current I passing through the inductance L related thereto. The sixth line indicates the chronological clock of the switch S3 which may be provided.

In the left part of FIG. 2, the state of the first actuation of the positioning element 1 is shown in the six graphs. The state of the second and of each further actuation after the charging of the positioning element 1 has once ensued, is shown by the center and by the right hand part of FIG. 2. The recharging of the positioning element from the source 2 is shown in line 3, with the reference symbol N' and N'' in line 4 indicating the residual discharge (elimination of the residual charge) of the capacitor C by means of closing the switch S3 (line 6, FIG. 2).

In broken lines, FIG. 1 shows a variation in which the source 2 and the switch S1 of the left-hand side of FIG. 1 are eliminated and these elements (designated S'₁ and 2' and connected in series) are instead connected parallel to the capacitor C. Thereby, their function remains unaltered. However, the capacitor C is here charged in the first operating step and the positioning element 1—when the switch S2 remains open—remains in its first, initial positioning state. The charging of the positioning element and its transition into the second positioning state then ensues in the next step, when the switch S2 is closed. Thereby, the first charging here also advantageously already occurs from the capacitor C. The the operations sequence as shown in FIG. 2 in the right-hand part and has been explained above.

It should also be pointed out that, in the circuit of FIG. 1—and the same also applies to the further developments in the remaining figures described below—, the location of the positioning element 1 and that of the capacitor C (in the circuit) can be interchanged. In particular, the capacitor C can also be a second positioning element (of a tandem positioning element) which is to be operated and actuated in push-pull, i.e. alternatively with respect to the first-mentioned positioning element 1. As regards the residual charge, that which has been stated above likewise applies, i.e. it already suffices to respectively eliminate the residual charge either at the capacitor C (as shown with switch S3) or at the further positioning element replacing the capacitor C.

Figure 3:
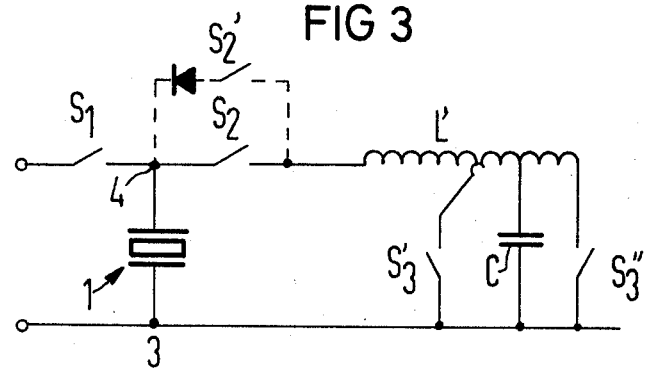
FIGS. 3 and 4 show further developments of the invention.

FIG. 3 shows an advantageous further development of the inventive principle according to FIG. 1. Details already described with respect to FIG. 1 have the same reference characters in FIG. 3. Two switches S3, namely S3' and S3'', are specified in FIG. 3. The switch S3' is connected to an intermediate tap of the inductance 11'. The switch S3'' is connected to a continuation of the inductance L'. The two switches S3' and S3'' alternatively are to be considered depending upon polarity, as is yet to be explained in greater detail.

Hereafter, the function of switch S3 in the version S3' is explained.

The initial charging of the positioning element 1 via the switch S1, the discharging of said element across the switch S2, and the recharging of the positioning element 1 from the capacitor C via the inductance L' and the switch S2 is carried out in the manner shown in FIGS. 1 and 2. In the example of FIG. 1, the residual charge of the capacitance C is destroyed when the switch S3 is closed. In the improvement according to FIG. 3, however, a voltage is induced in the inductance L' upon closing of the switch S3' which, transformed in accordance with the transmission ratio as can be seen, is additionally transferred to the positioning element 1 across the switch S2 which is then closed, i.e. gives said element a residual charge. Thus, a part of the re-supply from the source 2 described, for example in FIG. 1, can be replaced. A simplication in detail follows when—as indicated with broken lines—the switch S2 is replaced by the switch S2' with a diode connected in series, whereby the diode is switched to be transmissive for charge transfer from the capacitor C to the positioning element 1. The diode prevents the corresponding re-transfer during the closing time of switch 2'. Given opposite polarity of the residual charge from the capacitor C, the switch S3'' is employed. Accordingly, a reverse phase voltage transfer is achieved in the inductance L', i.e. a recharging of the positioning element 1 in proper phase.

The versions mentioned above also apply for the circuit according to FIG. 3, particularly the interchange of the locations of the positioning element and the capacitor in this circuit as well as the connection of two positioning elements (a second positioning element instead of the capacitor C) in this circuit and the feed from a source 2 which is connected parallel to the capacitor C or respectively parallel to the switch S3''.

Figure 4:
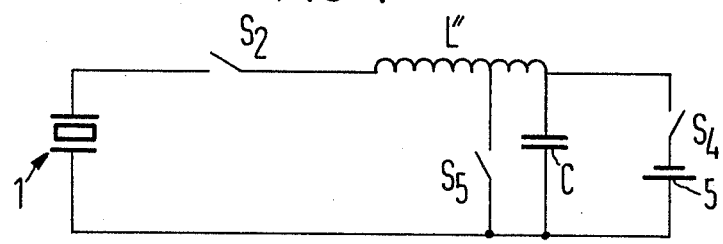

FIG. 4 shows a special further development of the invention, namely of the embodiment according to FIG. 3 in particular. The embodiment according to FIG. 4 is particularly suited for employment of the invention in vehicles in which a battery with, for example, 12 volts DC is available as the energy source proceeding from which a piezoelectric positioning element situtated in said vehicle (at the motor, in particular) is to be fed. Details already mentioned in conjunction with the description of the preceeding figures have the same reference characters in FIG. 4. The vehicle battery is referenced 5.

In the first operating state of this embodiment, the switches S4 and S5 are closed. The inductance L'' and the capacitor C are charged from the battery 5. In the following operating state, the switch S5 is opened and the switch S2 is closed, whereby the switch S4 first remains closed. Since the current previously flowing in the inductance L'' has the tendency to flow further, the capacitance of the positioning element 1 is charged and the field of the inductance L'' is collapsed. However, as soon as the current into the capacitance of the positioning element 1 falls to the value 0 and before the current begins to flow back out of the positioning element 1, the switch S2 is again opened and the positioning element 1 remains charged, i.e. has been brought from its previously voltage-free first operating state into its charged, second operating state. In case the positioning element 1 has not yet been fully charged in the initial state by means of the switching process step described above, this process step can be iteratively repeated until the desired charge is reached.

Further operation of the circuit according to FIG. 4, i.e. the return of the positioning element 1 into the first, uncharged operating state, again ensues by means of closing the switch S2 with the function sequence as is described in conjunction with the preceeding embodiments. The switch S5 is opened during this phase.

A next re-charge of the capacitance of the positioning element 1 now predominately ensues from the capacitor C, for which purpose the switch S2 is closed until the zero passage of the charging current. A re-charging for the compensation of the transfer loss ensues by closing the switches S4 and S5 as described above.

The circuit according to FIG. 4 can also be operated in a somewhat different manner, namely first the switches S4, S5 and S2 as well are closed in the first phase. The starting current is driven into the positioning element 1, and transferred in the inductance L″ in accordance with the differential quotient dI/dt. As soon as this charging current of the positioning element 1 has reached the zero passage (or as soon as the piezoelectric body 1′ of the positioning element 1 has been charged to the voltage necessary for the required change of length), the switches S2 and S5 are opened. The positioning element 1 again remains in its second, charged operating state.

In the embodiment according to FIG. 4, thus the initial generation and re-supply of the electrical energy during the operation is effected proceeding from the battery provided.

The use of the residual charge remaining in the capacitor C after transfer to the positioning element 1 can be made in the embodiment according to FIG. 4 as long as the electrical voltage of the residual charge exceeds the value of the nominal voltage of the battery 5. When the already charged positioning element 1 is now returned into its first, uncharged operating state given a closed switch S2 and an open switch S4, the electrical energy previously stored in the positioning element 1 is transferred to the capacitor C. For the renewed charging of the positioning element 1, the switch S2 is again closed and the electrical energy again flows from the capacitor C into the positioning element 1. The residual charge remaining in the capacitance C can be additionally transferred to the positioning element when the switch S5 is closed. Accordingly, the switch S4 still remains open until the voltage at the capacitor C has dropped to the value of the voltage of the battery 5. It is only then that the switch S4 is closed and it is only then that the recharge occurs, i.e. the compensation of previous losses from the battery 5. The further phases then cycle as described.

Figure 5:
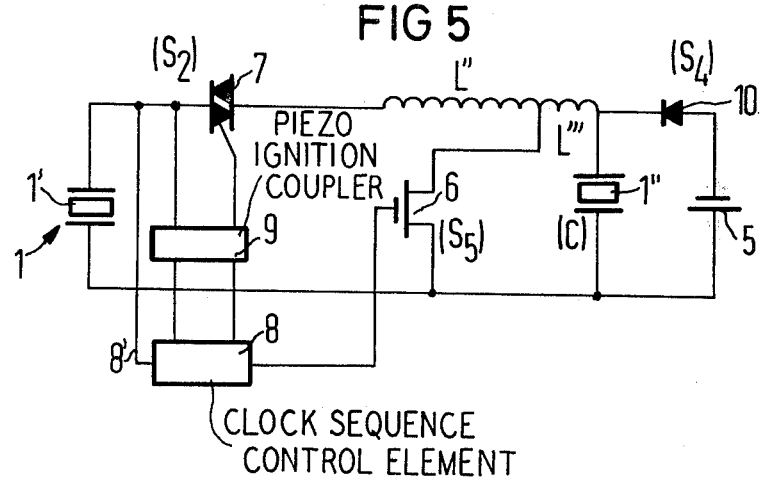
FIG. 5 shows another embodiment of the invention.

A practical execution of an inventive circuit is specified in FIG. 5, namely for a tandem positioning element according to German patent application P 3048631.8, incorporated herein by reference, whose details—insofar as described above—have reference symbols which coincide with those of FIGS. 1 through 4. The switch of FIG. 4 is a diode in FIG. 5. The switch S5 in FIG. 5 is a voltage-stable transistor, for example, a MOS power transistor 6.

In FIG. 5, the switch S2 is a triac 7 or a reverse parallel connection of two thyristors which is or, respectively, which are driven by a control element 8 in a clock sequence which is prescribed for activity of the positioning element 1. An electrically separating ignition coupler, for example a piezo-ignition coupler according to German patent applications P 30 15 301.6 and P 30 35 503.4 incorporated herein by reference, is shown at 9. The line 8′ serves for tapping and monitoring the achieved charging voltage.

In this instance, the capacitor C is a second piezoelectric body 1″ which is operated in reverse phase to the piezoelectric body 1′.

FIGS. 6 and 7 show preferred uses of a circuit arrangement according to the invention given a positioning element with, in the one case, two bodies (FIG. 6) to be operated in reverse phase and, in the other case, with two groups of piezoelectric bodies (of which the one group in the example illustrated only has one piezoelectric body (10*)) which are to be operated in reverse phase group-wise.

FIG. 6 shows a first embodiment of a positioning element $\overline{1}$. It consists of two piezoelectric bodies $\overline{10}$, $\overline{11}$, which are constructed of piezoelectric lamellae 13. Details of such a structure have already been disclosed in the earlier German application P 30 40 563.1, incorporated herein by reference. The upper (in FIG. 6) end of the piezoelectric body $\overline{11}$ is connected to the device $\overline{2}$ at which or, respectively, in which the inventive positioning element $\overline{1}$ is to be attached. This connection or attachment location is the securing location $\overline{12}$ of the positioning element $\overline{1}$. A cross arm is referenced $\overline{19}$ to which that end of the piezoelectric body $\overline{11}$ lying opposite the fastening location $\overline{12}$ is also secured and, at the side thereof, the lower (like-wise in FIG. 1) end of the second piezoelectric body $\overline{10}$ is secured, so that the two piezoelectric bodies $\overline{10}$ and $\overline{11}$ and the cross arm $\overline{19}$ together form an inflexible part. The upper (in FIG. 1) end of the piezoelectric body $\overline{10}$ is the function location of the positioning element $\overline{1}$ at which, for example, a tappet $\overline{4}$ is secured for outputting the stroke work of the illustrated positioning element 1. The stroke or stroke work of the positioning element $\overline{1}$ is indicated with the double arrow $\overline{20}$. A leaf spring secured to the device $\overline{2}$ and to the cross arm $\overline{19}$ is referenced with $\overline{18}$, said leaf spring absorbing the dynamic effects occurring with the double arrow $\overline{21}$. Without the leaf spring $\overline{18}$, the inventive positioning element $\overline{1}$ or, respectively, the cross arm $\overline{19}$ would execute excursion motions in the directions of the double arrow $\overline{21}$. The leaf spring $\overline{18}$ exerts no noticeable resistance to movement of the cross arm $\overline{19}$ in the direction perpendicular to the double arrow $\overline{21}$.

The illustrated positioning element $\overline{1}$ with its two piezoelectric bodies $\overline{10}$ and $\overline{11}$ functions according to the tandem principle, i.e., the two piezoelectric bodies $\overline{10}$, $\overline{11}$ are electrically connected in such manner that in the one positioning state the one piezoelectric body (for example, $\overline{11}$) has maximum elongation. In this case, the tappet $\overline{4}$ guided in the guide bore $\overline{5}$ projects only minimally beyond the upper edge of said bore $\overline{5}$. In contrast thereto, in the other positioning state given maximum elongation of the piezoelectric body $\overline{10}$ and maximum contraction of the other piezoelectric body $\overline{11}$, the tappet $\overline{4}$ projects in maximum fashion beyond the upper edge of the bore $\overline{5}$. Given piezoelectric ceramic and a laminar format as specified, the piezoelectric body has a maximum contraction, i.e. a shortest length, in the charged state and has its greatest longitudinal dimension, i.e. maximum elongation, in its electrically discharged state.

Details concerning the electrical operation of such a positioning element $\overline{1}$ proceed from the description specifically relating thereto, which also relates to the other embodiments of a further positioning element.

FIG. 7 shows a fundamental format of a further positioning element 1. The device to which the positioning element is to be attached is referenced with two asterisks. This, for example, is a part of the housing wall of an injection valve. This has a valve opening 3* in which the valve cone 4* secured in turn to the active end of the positioning element is situated. Three bodies which are constructed of piezoelectric lamellae 13 are referenced 10*, 11 and 12. As this has already been mentioned in the earlier German application P 30 40 563.1, the individual piezoelectric bodies 10*, 11, 12 can be constructed in accordance with different principles, for example with lamellae 13, 13' lying directly on top of one another or with lamellae 13, 13' between which inactive intermediate layers are situated. The individual lamellae 13, 13' of a respective body 10*, 11, 12 are rigidly connected to one another with their principle surfaces (perpendicular to the plane of the drawing of FIG. 7) in such manner that the lamellae 13, 13' cannot be moved with respect to one another. The impressed electrical polarization of the individual lamellae 13, 13' is indicated with arrows 14. Electrode coatings, for example in the form of sputtered-on metallizations 15 of the ceramic surface, are applied between the lamellae 13, 13' of a respective body 10*, 11, 12 and to the outer principle surfaces of said lamellae. The reference character 16 indicates layers situated between the lamellae 13, 13', i.e. between the mutually opposite metallization layers 15, said layers effecting the mechanical connection of respectively adjacent lamellae 13, 13' to one another. The layers 16 can preferably be adhesive. However, they can also comprise a solder layer formed by a soldered connection of adjacent metallization layers 15. Further, these individual spacing layers 16 can also be adhesive films such as, for example, the glass-fiber reinforced expoxide material "Prepreg," a trademark of the Ciba Company.

One body 10* is disposed between at least two further bodies 11 and 12. The upper (in FIG. 1) ends 211 and 212 of the two outside bodies 11 and 12 are rigidly connected to part 17, for example by means of bonding, being screwed on, or the like, whereby said part 17 can also be a portion of the housing wall 2* or, preferably as illustrated, can be adjustably and alignably secured to the housing wall 2* with screws 18. As shown in the illustration of FIG. 6, lower ends 110, 111, 112 of the bodies 10*, 11, 12 are connected to one another by means of a flexuarly stiff cross arm 19. An elongation of the bodies 11 and 12 due to the removal of an electrical voltage previously applied in a polarization promoting direction leads to a downward (in FIG. 6) motion of the cross arm 19. Since a symmetrical format with two bodies 11 and 12 is present, no torque or tilting moment influences the cross arm 19. Upon elongation of the bodies 11 and 12, the lower end 110 of the body 10* is pulled down. Given additional motion in the opposite direction, namely contraction of the body 10* due to the application of a polarization-promoting voltage, the part 4* which is rigidly connected to the upper end 210 of the body 10* is moved down. The elongation of the bodies 11 and 12 and the contraction of the body 10* which is preferably executed simultaneously additively leads to doubled stroke motion of the part 4* as indicated with the arrow of the double arrow 20 which points down. Contraction of the bodies 11 and 12 and expansion of the body 10*, preferably simultaneously, leads to a corresponding movement of the part 4* which is directed toward the top and is indicated with the upper end of the double arrow 20.

The symmetrical structure as illustrated and described, leads to purely longitudinal motion of the part 4* and tilting or pivoting motions are avoided. A corresponding result is also achieved with 3, 4 or more suitable outside bodies such as represented by the bodies 11 and 12. Instead of the single body in the center as described above, another version of the structure can also have two or more bodies symmetrically disposed between the bodies 11 and 12, both functioning in the same direction. Given such as embodiment, the one center body 10* is, so to speak, divided into two individual bodies which can be at a distance from one another and which are again disposed symmetrically with respect to the outside bodies which respectively function in the opposite direction. The reference strip-shaped cross arm 19 described above must then have a correspondingly large area in order to be able to accept all lower ends of all bodies and it must also be correspondingly flexuary stiff to a sufficient degree. Such an embodiment with two inside bodies can be advantageous insofar as these two inside bodies and two corresponding outside bodies 11 and 12 can have the identical structure in and of themselves and thus an electrical capacitance of the same size can exist for the inside bodies on the one hand and for the outside bodies on the other hand.

In detail, the fundamental structure according to FIG. 7 can also be designed in even further, multiply varied embodiments, depending upon the specific importance which is attached to one or several of the overall advantages offered with the inventive principle. Thus, priority can be placed, for example, on optimum dynamic effect, or respectively on optimum power use. In other cases, fast response and fast execution of the dilation or elongation and contraction motion can be particularly important, for example, for fast opening and closing of a valve. It is recommended that the active cross-section of all piezo-ceramic lamellae 13 of the inside body 10* and the sum of the active cross sections of all piezo-ceramic lamellae 13' of the two bodies 11 and 12 together be of the same size.

What is meant by active cross-section of the piezo-ceramic lamellae 13, 13' is that cross-section surface which lies perpendicular to the plane of the drawing of FIG. 1 and perpendicular to the principle surface (covered with the metallization 15) of the lamellae 13, 13'. For example the surface normal to the respectively addressed cross-section surface is parallel to the longitudinal direction of said lamellae 13, 13' indicated with the double arrow 1. The metal coatings 15 (already very thin anyway) and the intermediate layers 16 consisting, for example, of adhesive and intermediate layers, or respectively of spacing layers or films which may additionally be provided and are not illustrated in the figure, are piezo-electrically inactive. The respectively cited sum of the cross-sections thus refers only to the piezo-ceramic cross-sections of the lamellae 13, 13'. The term "active" cross-section is employed for this.

Given the embodiment explained above with active cross-sections for the inside body 10* and for the sum of the outer bodies 11 and 12 which are of the same size, the power generation and the stroke and thus the work are equally divided between the inside body 10* and all of the outside bodies 11 and 12. The electrical capacitances of the body 10* on the one hand and of all of the bodies 11 and 12 on the other hand are of the same size. Thus, the two energy storages are likewise of the same size and, because of the opposing operation of these two parts of the illustrated positioning element, it is possible here to allow the electrial excitation energy necessary for the operation of the positioning element to flow back and forth from one energy storage to the other energy storage. When this back and forth flow ensues across a suitably dimensioned inductance-and, of course across a controllable switch lying in series thereto-then a practically loss-free back and forth transfer of the complete energy necessary for the positioning operation can ensue. If, given this embodiment one only wishes to employ uniformly designed bodies, the version of the inside body 10 already described above can be provided instead of the single body 10* illustrated in FIG. 1, and two such bodies disposed next to one another and mechanically connected in parallel can be employed, as are provided for the bodies 11 and 12.

In contrast thereto, for a very fast motion of the part 4*, for example the cone of a valve, it is recommended that of the two parts of the illustrated positioning element mechanically connected in series (namely, of that part formed on the one hand by the bodies 11 and 12 and that part formed on the other hand by the body 10) the part which lies closer in the mechanical force flow to the part 4* to be moved is designed with lesser mass. In the illustration of FIG. 7, this is the body 10*. For example, a single body identical to the bodies 11 and 12 can be employed as the body 10, this then accordingly has only half the inert mass of the bodies 11 and 12 together. This lighter body 10* can then correspondingly be accelerated faster-namey twice as fast-with the same force, so that nearly twice as great a response speed is achieved for the part 4*. The only thing which must be sacrificed is that an inside body dimensioned in this manner contributes a correspondingly reduced positioning power to the overall sum of the positioning powers of the entire inventive positioning element.

When given this embodiment, one employs three identical, laminated bodies of the three bodies illustrated in FIG. 7 in such manner, then the inside laminated body functioning in an opposite manner to the bodies 11 and 12 has an electrical capacitance which is only half as large. A corresponding, electrical auxillary capacitor must then be connected parallel to the inside body of the positioning element for the purpose of a complete transfer of the electrical excitation energy as described above.

Two versions have been described above. In the first, a sum of the cross-sections of the outside bodies 11, 12 is equal to the cross-section of the one (or of the sum of divided bodies) inside body 10*. In the second embodiment, a capacitance for the two outside bodies 11, 12 is twice as great as that of the inside body. In the former case, optimum positioning force and complete charge balance for a charge transfer are given. In the latter case, one obtains a positioning element which has a higher work and response speed. Compromise solutions lie between these two instances when the ratio of the sum of the active cross-sections of the outside bodies to the active cross-section of the inside body lies between the values 1 and 2.

With the connection lines having the reference characters a through f, FIG. 7 additionally shows an exemplary electrical circuit for the lamellae 13, 13'. Electrode coatings 15 which respectively lie opposite one another are electrically connected to one another. A respectively opposite polarization direction in the piezoelectric material in the direction of the thickness of the lamellae exists in lamellae 13, 13' which are adjacent to one another. As illustrated, inside electrode coatings 15 connected to one another are connected to a respective outside electrode coating 15. The piezoelectric body 10 has the terminals a and b conducted toward the outside. The two piezoelectric bodies 11 and 12 have the terminals e and f as well as c and d conducted toward the outside. In accordance with the interconnection of the piezoelectric bodies 11 and 12 as a group A, the external connections c and e on the ther hand are connected to one another. As a grounded terminal, the terminal c and e are also connected to the terminal a of the piezoelectric body 10 to be operated in reverse phase. The external terminal b of the piezoelectric body 10, which here forms the group B, is galvanically separated from the common external terminal f of the piezoelectric bodies 11 and 12 of group A.

FIG. 7a shows a version with two inside piezoelectric bodies 10', 10" (instead of a single body 10). In this version, four identical bodies can be advantageously employed, whereby the bodies 10', 10" form the group B and the bodies 11, 12 form the group A with capacitances which are respectively of the same size.

A more detailed description of the circuit used in the system of FIG. 5 will be described.

The switches S2 (element 7 in FIG. 5) and S5 (element 6 in FIG. 5) are controlled by the control member 8. For the utilization of the positioning element 1' (or both positioning elements 1', 1") as a respective mechanical drive for valves of a motor or compressor, this control member 8 is controlled by a cam shaft of the motor which, as in the case of the conventional motor is matched to the angular position of the crankshaft. This cam shaft indirectly influences the switches S5 and S2 in the invention. For this purpose, the control member 8 according to a simple embodiment contains two switches S5' and S2', driven by the cam shaft, which are individually approximately comparable to a known interrupter contact of a motor ignition system, and which supply, from a voltage source, electric signals to the switches S5 and S2 (or via the coupler 9 to S2, respectively). The clock pulse sequence for the switch S2' corresponds to the clock pulse sequence for the switch S2, as is indicated with the additional pulses in FIG. 2, following the first charging operation, i.e., following the first pulse. The clock pulse sequence for S6' corresponds to that for the switch S6. For the current flow through L''' and then closed switch S6, the switch 6' is opened. If the switch S6 is to be opened, then the switch S6' is closed by the cam shaft. With the closing of the switch S6', the switch S2' is closed—namely, when the charging of the adjustment element 1' via the switch S2 is to take place—in order that the switch S2' according to FIG. 2 closes for the charging.

The line 8' is of no importance in the case of a control as described above. For the precedingly described example, the individual parts of the circuit are merely to be dimensioned such that the necessary charging UH of the adjustment member is always reached. S2 again opens so promptly that the adjustment member 1' remains charged as long as the valve is to be actuated; for example, kept open.

Figure 8:
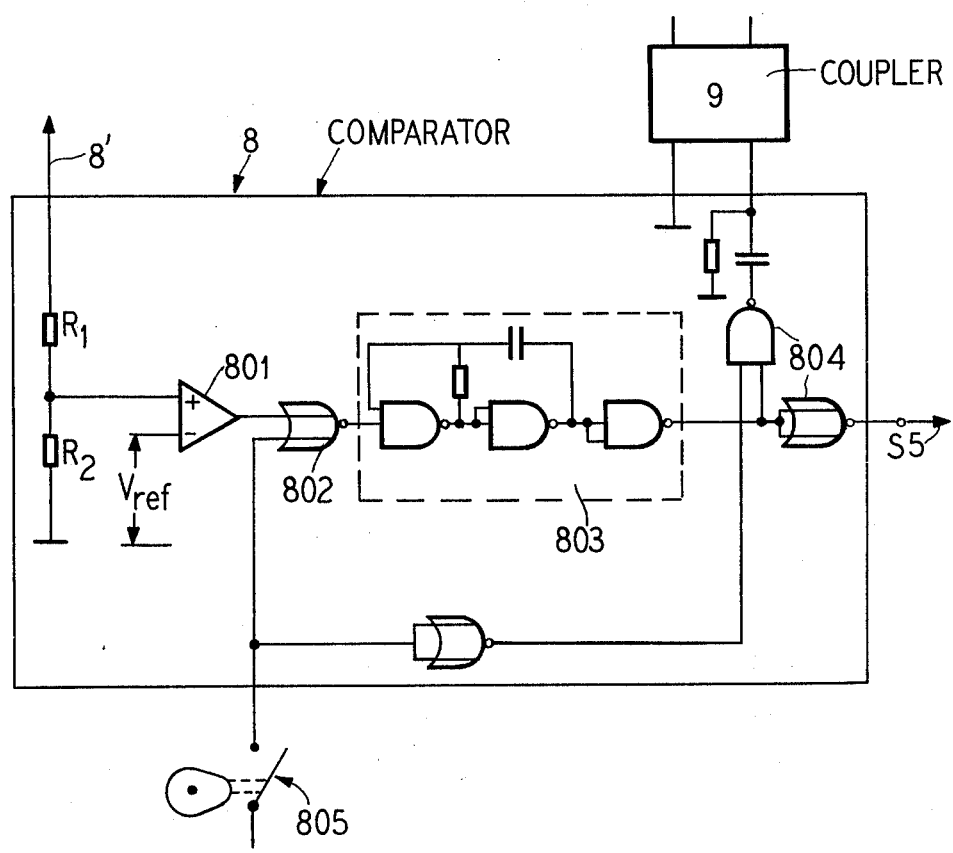
FIG. 8 shows a diagram for control circuiting used in FIG. 5.

As shown in FIG. 8, with the signal on the line 8', i.e. with the control of the charging voltage UH, an electronic control can be constructed which is then to be further controlled only by a single open-closed-contact 805 (which is actuated by the cam shaft). Reference numeral 8 designates a comparator, for example type 741 which is essentially an operational amplifier. Its positive input is connected with the center tap of a voltage divider consisting of two resistances R1 and R2. The line 8' is connected to the hot end of this voltage divider. The negative input of the operational amplifier 801 is connected with the reference voltage. Via a NOR-circuit 802, the comparator 801 is connected with an astable multi-vibrator 803 which consists of a number of NAND circuits. The output of this astable multi-vibrator 803 is connected, via additional circuits 804, with the feed line of the control member 8 to the gate connection of the switch S5, or with the one feed line of the control member 8 to the coupler 9, respectively.

For example, CD4011 may be employed as the NAND circuit, and CD4001 may be employed as the NOR circuit.

The circuit according to FIG. 8 for the control member 8 is an electronically controlled sequence control which merely requires, from the contact 805 of the cam shaft, the clock pulse control corresponding to the angular position of the crankshaft.

Although various minor modifications may be suggested by those versed in the art, it should be understood that we wish to embody within the scope of the patent warranted hereon, all such embodiments as reasonably and properly come within the scope of our contribution to the art.

We claim as our invention:

1. A circuit arrangement, comprising: a piezoelectric positioning or control element to be alternatively charged and discharged and having at least one piezoelectric body designed to be charged and discharged; a series connection of a capacitive element, an inductance and a controllable first switch, said series circuit being connected to terminals of the at least one piezoelectric body of the positioning element; the capacitive element having at least approximately a same capacitance value as a capacitance of the at least one piezoelectric body; the inductance having a value sufficiently large to be able to magnetically intermediately store substantially an entire energy to be transferred between the positioning element and the capacitive element; the first switch being connected to permit termination of a charge transfer of a respective transfer current; a series circuit comprising an electrial energy source means for initial charging and re-charging and a controllable second switch, said series circuit being connected parallel to the positioning element; and a controllable short-circuit switch being connected parallel to the capacitive element.

2. A circuit arrangement according to claim 1 wherein the capacitive element comprises a further piezoelectric body connected for reverse phase operation relative to the first piezoelectric body.

3. A circuit arrangement according to claim 1 wherein the capacitive element comprises a capacitor.

4. A circuit arrangement according to claim 1 wherein the inductance has a tap to which is connected a short-circuit switch.

5. A circuit arrangement according to claim 1 wherein the voltage source comprises a battery.

6. A circuit arrangement according to claim 5 wherein the inductance has a tap; and the battery, the second switch, the short-circuit switch, the inductance to the tap, and the overall inductance form a voltage transformer means for conversion of the electrical voltage of the battery into a required high voltage.

7. A circuit arrangement according to claim 1 wherein the first switch comprises a triac.

8. A circuit arrangement according to claim 1 wherein the first switch comprises a parallel reverse polarity connection of two thyristors.

9. A circuit arrangement according to claim 1 wherein the second switch comprises a diode.

10. A circuit arrangement according to claim 1 wherein the short-circuit switch comprises a high voltage transistor.

11. A circuit arrangement according to claim 1 wherein the capacitive element comprises a second piezoelectric body of the positioning element connected for reverse phase operation.

12. A circuit arrangement according to claim 1 wherein the capacitive element comprises a second piezoelectric body in the same positioning element, the two piezoelectric bodies being of approximately equal length lying next to one another and connected to one another at one end with a cross arm, and wherein a useful movement is obtained at one end of one body relative to the other body, the two bodies operating in reverse phase such that when one is charged the other is discharged so that while one is in a lengthened condition the other is in a contracted condition.

13. A circuit arrangement, comprising: a piezoelectric positioning or control element to be alternately charged and discharged, and having at least one piezoelectric body designed to be charged and discharged; a series connection of a capacitive element, an inductance and a first controllable switch, said series circuit being connected to the terminals of the at least one piezoelectric body of the positioning element; the capacitive element having at least approximately a same capacitance value as a capacitance of the at least one piezoelectric body; the inductance having a value sufficiently large in order to be able to magnetically intermediately store substantially an entire energy to be transferred between the positioning element and the capacitive element; the first switch being connected to permit termination of a charge transfer of a respective transfer current; a series circuit comprising an electrical energy source means for initial charging and re-charging and a controllable second switch, said series circuit being connected in parallel to the capacitance element; and a controllable short-circuit switch being connected parallel to the capacitive element.

14. A circuit arrangement, comprising: a positioning element having first and second piezoelectric bodies to be charged and discharged in reverse phase; a series circuit comprising a controllable switch means and a power source connected in parallel across the first piezoelectric body; a series circuit comprising another controllable switch means, an inductance and the second body being connected in parallel across the first body; and a short circuit switch means connected in parallel with the second body.

15. The arrangement of claim 14 wherein the controllable switch means connnected to the power source comprises a diode, said another controllable switch means comprises a bidirectional current element controlled by a first control circuit; and the short circuit switch means comprises a transistor controlled by a second control circuit.

16. A method for operating a circuit containing a piezoelectric positioning element having at least one piezoelectric body and wherein a series circuit formed of a first switch, inductance, and capacitive element is connected in parallel across the body, wherein a short-circuiting switch is connected across the capacitive element, and wherein a power source in series with a second switch is connected to supply power to the single body, comprising the steps of: closing the first switch to charge the body while the short circuit switch is opened.

17. The method of claim 16 including the further steps of after charging the body, opening the second switch and closing the first switch to charge the capacitive element and discharge the body.

18. The method of claim 17 wherein to charge the body and to discharge the capacitive element, the first switch is closed for a predetermined period and then opened and the short circuit switch is closed to remove a residual charge from the capacitive element.

19. A method according to claim 16 wherein the short circuit switch is opened upon attainment of charging voltage of the piezoelectric body.

20. The method of claim 16 wherein the short circuit switch is opened upon attainment of charging voltage of the capacitive element.

* * * * *